United States Patent [19]

Riollet

[11] 4,165,949

[45] Aug. 28, 1979

[54] HIGH EFFICIENCY SPLIT FLOW TURBINE FOR COMPRESSIBLE FLUIDS

[75] Inventor: Gilbert Riollet, Paris, France

[73] Assignee: Groupe Europeen pour la Technique des Turbines a Vapeur G.E.T.T., Paris, France

[21] Appl. No.: 821,863

[22] Filed: Aug. 4, 1977

[30] Foreign Application Priority Data

Aug. 13, 1976 [FR] France ............................ 76 24765

[51] Int. Cl.² ..................... F01D 1/04; F01D 5/22; F01D 9/00
[52] U.S. Cl. ................................. 415/77; 415/144; 415/199.5; 415/213 C; 416/193 R
[58] Field of Search .................. 415/77, 199.5, 208, 415/213 C, 217, 218, 144; 416/193 R; 60/39.75

[56] References Cited

U.S. PATENT DOCUMENTS

| Re. 15,092 | 4/1921 | Baumann | 415/77 |
|---|---|---|---|
| 1,263,473 | 4/1918 | Schellens | 415/77 |
| 1,343,956 | 6/1920 | Baumann | 415/77 |
| 1,493,266 | 5/1924 | Junggren | 415/144 |
| 1,597,467 | 8/1926 | Hodgkinson | 415/77 |
| 3,193,185 | 7/1965 | Erwin et al. | 415/213 C UX |

FOREIGN PATENT DOCUMENTS

| 574106 | 3/1924 | France | 415/77 |
|---|---|---|---|
| 731766 | 5/1932 | France | 415/77 |
| 719236 | 12/1954 | United Kingdom | 415/199.5 |

Primary Examiner—Carlton R. Croyle
Assistant Examiner—Donald S. Holland
Attorney, Agent, or Firm—Sughrue, Rothwell, Mion, Zinn and Macpeak

[57] ABSTRACT

In a turbine for a compressible fluid in which the fluid flow leaving the antepenultimate stage is separated into two coaxial flows, the inner flow passes through both the penultimate and the final stages of the turbine while the outer flow passes through the final stage only. This high efficiency arrangement for the last stages of a high power turbine exploits the advantages made available by using titanium as the blade material.

9 Claims, 3 Drawing Figures

HIGH EFFICIENCY SPLIT FLOW TURBINE FOR COMPRESSIBLE FLUIDS

FIELD OF THE INVENTION

The present invention concerns a turbine for compressible fluids in which the flow of fluid at the outlet of the antepenultimate stage is separated into coaxial inner and outer flows which are subject to substantially the same decrease in enthalpy between the outlet from the antepenultimate stage and the outlet of the turbine, the inner flow passing through the penultimate and final stages of the turbine with respective decreases in ethalpy of $h_1$ and $h_2$, and the outer flow passing through only said final stage.

BACKGROUND OF THE INVENTION

In known Baumann-type turbines, the outer flow passes through the penultimate stage of the turbine.

Baumann turbines have the advantage of a large outlet cross-section, but they also have a number of disadvantages, especially in so far as they require two rotors with long blades which are difficult to construct and very expensive, and in that the rotor blades of the final stage are subject to severe erosion when the fluid is a condensable one.

Preferred embodiments of the invention provide turbines for compressible fluids which do not have these disadvantages.

SUMMARY OF THE INVENTION

The present invention provides a turbine for compressible fluids in which the fluid leaving the antepenultimate stage is separated into coaxial inner and outer flows which are subject to substantially the same decrease in enthalpy between the outlet from the antepenultimate stage and the outlet of the turbine, the inner flow passing through the penultimate and final stages with respective decreases in enthalpy of $h_1$ and $h_2$ and the outer flow passing through only said final stage, the turbine being characterized in that the rotor blades of the last stage include a wall serving as a barrier between the inner flow and the outer flow and in that at this barrier the degree of reaction of the said rotor blades when operating under aerodynamic adaptation conditions has a value $x_2$ on the outer flow side which is substantially equal to $x_1 \cdot h_2/(h_1 + h_2)$ where $x_1$ is the value of the degree of reaction on the inner flow side.

In the turbine in accordance with the invention, the long blades of the final stage rotor are not so wide as the blades of the final stage of a conventional turbine producing the same rate of fluid flow for the same length of blade.

As is well known, the rotor blades of the final stage generally have a pronounced curvature at the root, straightening out towards the tip.

To minimize the traction and flexing loads on the blades, it is necessary to have large blade cross-sections, especially at the root, and this can lead to prohibitive axial dimensions.

In the turbine in accordance with the invention, the variation in the profile of the final stage rotor blades from the root to the tip incorporates a discontinuity, and the profile of the blade outside the interface between the two flows is more highly curved than that inside this interface.

This geometrical feature of the blades is a direct result of the fact that in the final stage the flow degree of reaction decreases suddenly across the interface separating the inner and outer flows.

The local increase in curvature, and the consequent increase in rigidity, decreases over the length of the rotor blade section in the outer flow, so that while the bending stresses are kept equal to those in conventional rotor blades, the width of the rotor blade in accordance with the invention can be significantly reduced. The degree of reduction in cross-section is determined at the point which the aerodynamic loads produce the highest bending stresses, the cross-section at other points being reduced in proportion, especially at the root, without changing the stress due to centrifugal tractive loads on the blade.

Furthermore, the decrease in enthalpy in that part of the final stage through which the outer flow passes can always be made equal or nearly equal to the enthalpy decrease corresponding to the optimum aerodynamic efficiency, as the enthalpy decrease in the outer flow is sufficiently high. Also, in the case of condensable fluids, the blades are then protected against erosion by droplets of condensed vapour.

The impact energy of droplets of the fluid in the inner flow is considerably less, and the decrease in enthalpy in this section of the final stage can be close to the value producing the maximum efficiency, even though considerably less than the decrease in ethalpy of the outer flow.

Finally it is known that if the flow rate of a compressible fluid through the last stage of a turbine drops below its optimum value there is a large disturbance and the fluid tends to flow only through the outer portions of the blades and ceases to fill their inner portions. This phenomenon, which may go so far as to cause a turning detachment on the upper profiles of the blades, causes a rapid drop in efficiency and also produces pulsed forces on the blades which are very dangerous if the turning detachment occurs. These drawbacks become worse as the ratio between the blade length/the base diameter is increased.

The invention tends to reduce these injurious effects since the inner flow remains filled at low flow rates because the $h_1 + h_2$ decrease is maintained over the last two stages and because the outer flow behaves as if it were acting on a rotor blade whose length/base diameter ratio is more favourable than that of the last stage taken as a whole.

If in accordance with the invention the degree of reaction $x_2 = x_i \cdot h_2/(h_2 + h_1)$, then the pressure in the final stage rotor is the same on each side of the interface between the two flows, which means that no fluid leaks across the interface. Generally speaking the value of $x_2$ is between 0.3 and 0.7 times $x_1$. If the decrease in enthalpy in the penultimate and final stages is the same, in the part of the turbine through which the inner flow passes, the pressure in the final stage rotor is the same on each side of the interface if $x_2 = x_1/2$.

In accordance with another preferred feature of the invention, the interface between the coaxial inner and outer flows in the final stage rotor is at a mean distance $r_p$ from the turbine axis which is between 1.35 and 1.55 times $r_b$, which is the distance of the blade roots from the turbine axis.

The value of $r_p$ is preferably substantially equal to $$r_b \cdot \sqrt{\frac{h_1 + h_2}{h_2} \cdot \frac{1 - x_o}{1 - x_2}}$$

where $x_0$ is the degree of reaction of the inner flow at the root of the final stage rotor blades. This is because with this relationship between the values of $r_p$ and $r_b$, it is possible to achieve enthalpy decreases of $h_1 + h_2$ in the outer flow and $h_2$ in the final stage inner flow which means that the efficiencies of the two flows are substantially equal and correspond to the maximum possible aerodynamic efficiency.

If $h_1 = h_2$, the value of $r_p$ must be substantially equal to $r_b \cdot \sqrt{2} \cdot (1-x_0)/(1-x_2)$, which in practice is not very different from a value of $r_b \cdot \sqrt{2}$.

The advantages of the turbine in accordance with the invention are of increasing importance as the blade length is increased, the result of which is that the blades are subject to high centrifugal inertia loads requiring the use of materials such as titanium which have a high value of the ratio elastic limit/density.

The present invention will be better understood from the following description and drawings.

DESCRIPTION OF THE PREFERRED EMBODIMENT

Figure 1:
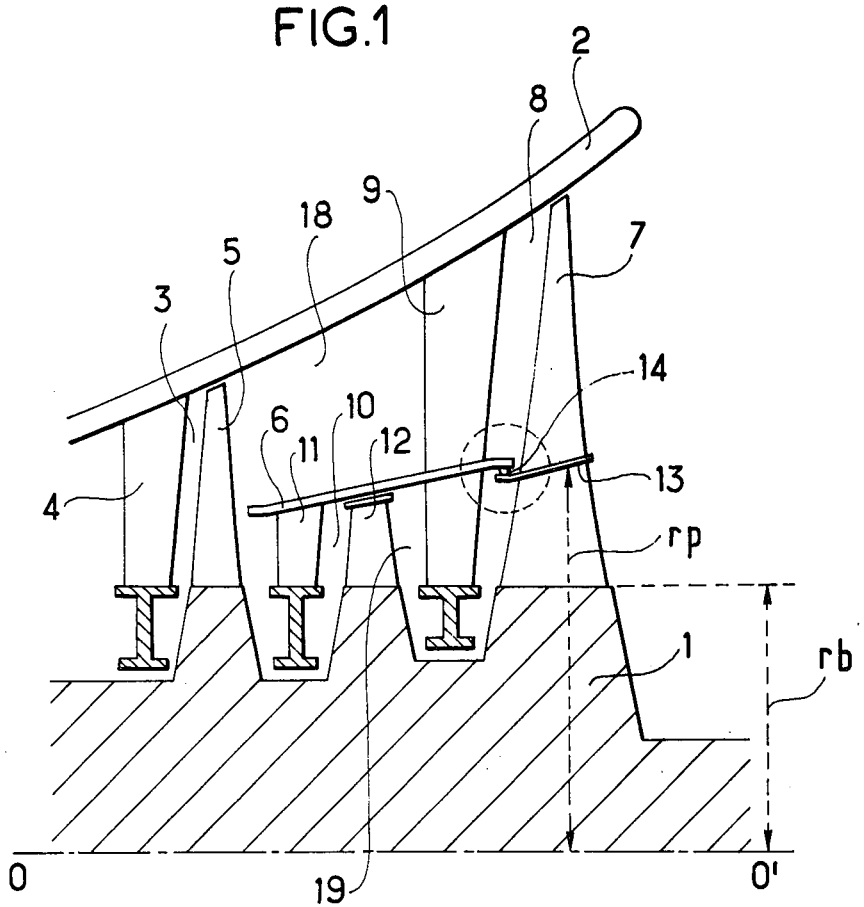
FIG. 1 shows a turbine in accordance with the invention in axial cross-section.

FIG. 1, which is an axial cross-section through the turbine for compressible fluids, such as steam, in accordance with the invention, shows only the final three stages of the turbine.

The turbine comprises a rotor 1 which rotates inside a stator 2.

The antepenultimate stage is of conventional design, and comprises a ring of director blades 4 attached to the stator 2 and a ring of rotor blades 5 attached to the rotor 1.

A wall 6 runs right round the turbine axis 0-0', extending from the outlet from the antepenultimate stage 3 almost to the inlet to the rotor blades 7 of the final stage. This wall 6 is attached to the ring of director blades 9 of the final stage 8, which is itself attached to the stator 2.

The penultimate stage 10 comprises a ring of fixed blades 11 and a ring of rotor blades 12. The ring of fixed blades 11 is attached to the wall 6 and surrounds the rotor 1, inside the space defined by the wall 6.

The ring of rotor blades 12 is mounted on the rotor 1, and its perimeter is close to the wall 6.

The rotor blades 7 of the final stage 8 are fitted with a wall 13 running around the turbine axis and substantially aligned with the wall 6. The wall 13 is cylindrical or frusto-conical. At the junction of walls 6 and 13 is located a seal 14 which may consist, for example, of one or more vanes mounted on the fixed wall 6 facing the end of the rotating wall 13.

The degree of reaction $x$ of each rotor blade of the final stage 8 increases from a value $x_0$ at the blade root to a value $x_1$ at the rotary wall 13. For example, $x_1$ may be between 30% and 60%. The degree of reaction $x_0$ at the blade root may, for example, be between $-10\%$ and $+20\%$.

The degree of reaction $x_2$ at the outside of the rotary wall is between 0.3 and 0.7 times $x_1$, and the degree of reaction increases in value out to the blade tip.

Figure 2:
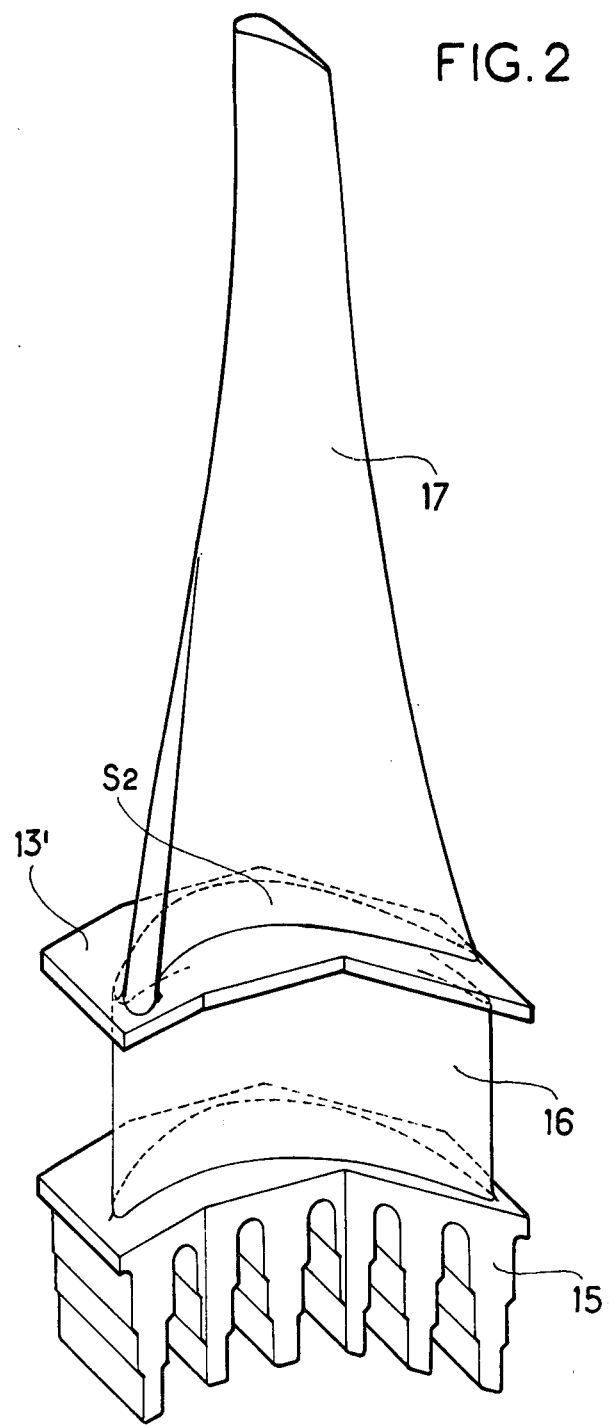
FIG. 2 shows a rotor blade of the final stage of the turbine in accordance with the invention.

FIG. 2 is a perspective view of a final stage rotor blade in accordance with the invention, showing the member 15 for attaching the blade to the rotor and a section 13' of the rotating wall 13 separating the section 16 of the blade driven by the inner flow from the section 17 driven by the outer flow.

The attachment member 15 shown in FIG. 2 is of the conventional multi-fingered fork type, but alternative attachment means may be used instead, oak leaf attachments, for example.

The section 13' of the rotating wall 13 is integral with the blade, and fits exactly to the identical sections of the adjacent blades to form a continuous wall enclosing the inner flow. In the case of a forged blade, the wall section 13' may be forged with the body of the blade. Alternatively, the wall section may be machined from the mass of blade material. The wall sections 13' of adjacent blades come into contact with one another when the blades are fitted to the rotor, and are pressed tightly together when the rotor rotates because of the twisting blade deformation produced by centrifugal loads on the rotor.

The outer portion 17 of the blade may comprise any necessary means for connecting it to the adjacent blades. Such means, which include wires and fins, are well known to those skilled in the art and are not required as a result of inherent requirements of the present invention, and so are not shown in the drawings.

Figure 3:
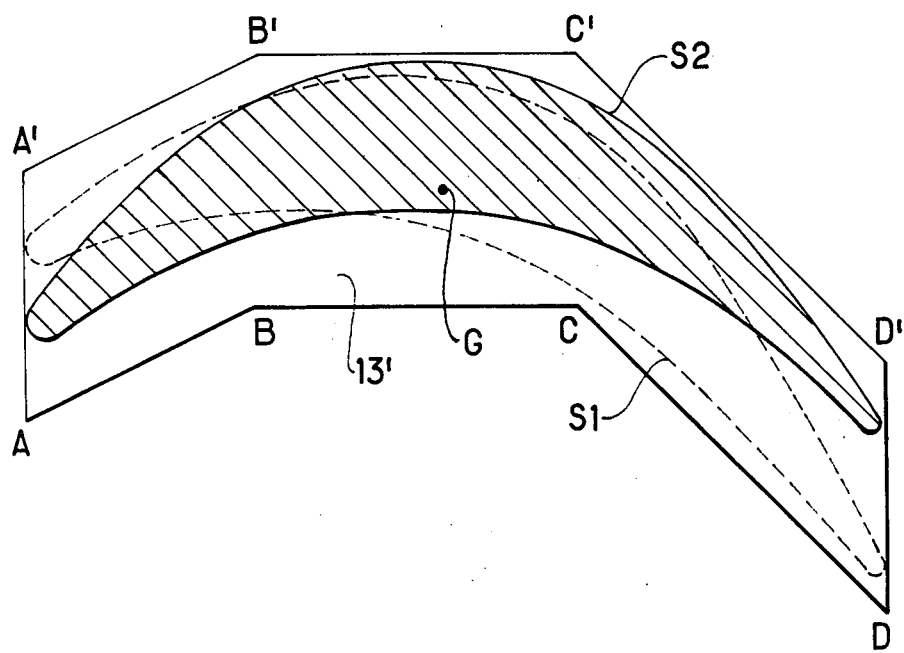
FIG. 3 is a cross-section through the blade of FIG. 2, just outside the interface between the inner and outer flows.

FIG. 3 shows a cross-section through a final stage rotor blade in a plane tangential to a cylinder of revolution coaxial with the turbine axis 0-0' and just outside the rotating wall 13. This plane passes through the outer portion 17 of the blade with the basic profile S2, which is highly curved because of the low value of the degree of reaction at this point. This figure also shows the perimeter of the wall section 13', defined by points A, B, C, D, A', B', C' and D'. The rectilinear sections of the profile form parallel pairs, and mate with the corresponding sides of the sections 13' of the rotary wall 13 on the adjacent blades. The wall section 13' may have any suitable profile, a circular profile, for example, and not just the polygonal one shown in the figure.

The dotted profile S1 is that of the section of the blade just inside the rotating wall 13. As the degree of reaction $x_1$ for this profile is greater than dotted profile $x_2$, S1 is less highly curved than S2. By taking certain precautions, however, which basically consist in locating the centres of gravity of the two profiles on a common radius, giving them similar outlet angles, and giving S1 a negative aerodynamic incidence, it is possible to significantly reduce the discontinuity between profiles S1 and S2. In this way excessive increases in the centrifugal stress at the point where the blade passes through the rotating wall 13 can be avoided.

Referring again to FIG. 1, it will be seen that the rotary wall 13 is situated at a mean distance $r_p$ from the turbine axis 00' which is between 1.25 and 1.55 times $r_b$, which is the distance of the blade root from the axis 00'.

The wall 6 divides the fluid at the outlet from the antepenultimate stage 3 into coaxial inner and outer flows. The outer flow passes through an outer passage 18 defined by the stator 2 and the walls 6 and 13.

The inner flow passes through an inner passage 19 defined by the walls 6 and 13 and the rotor 1.

The outer passage 18 comprises a single stage 8, and the inner passage 19 comprises two stages, 10 and 8.

In the inner passage 19, the decrease in enthalpy in the penultimate stage 10 is $h_1$ and in the final stage 8 it is $h_2$.

As the enthalpy decrease in the outer passage is substantially equal to that in the inner passage, it is in the region of $h_1 + h_2$.

It is known that the enthalpy decrease producing the highest aerodynamic efficiency is proportional to the kinetic energy which corresponds to the speed $U_b$ at which the fluid flows at the blade roots: $h_{max} = k \cdot U_b^2/2$. When it is of the impulse type, the coefficient of proportionality k is about 4.

In the outer passage 15, $U_b$ is the velocity of the fluid flow at the outer surface of the rotating wall 13. As the degree of reaction $x_2$ is low and $r_p$ is larger than $r_b$, $U_b$ is higher at the outer surface of the wall 13 than at the blade root, so that the optimum enthalpy decrease is higher than that for a conventional final stage. It follows that a value of $h_1 + h_2$ equal or nearly equal to this value may be used, producing the optimum efficiency while erosion due to droplets of the fluid is avoided by virtue of the large value of the decrease. It is worth noting that if the decrease in enthalpy in the final stage of a conventional turbine which results in the optimum efficiency is h, then it is current practice to choose an enthalpy drop of around 1.5 h, in order to avoid erosion due to condensed droplets of the fluid, which significantly reduces the efficiency.

If the efficiency in the inner channel is to be equal to that in the outer channel, $r_p$ must be substantially equal to $$r_b \cdot \sqrt{\frac{h_2 + h_1}{h_2} \cdot \frac{1 - x_o}{1 - x_2}}$$

where $x_0$ is the degree of reaction at the blade roots, in the inner flow. Thus if $h_1 + h_2$ is the decrease in enthalpy corresponding to the optimum efficiency in the outer passage, the enthalpy drop corresponding to the maximum efficiency in the inner channel can also be utilised.

The enthalpy drop $h_2$ is not high enough to significantly reduce the quantity of condensed fluid striking the rotor blades, but this is not of great importance since the low circumferential velocity of the blades in the inner passage means that the impact of droplets of condensed fluid on the blades is not serious.

If $h_1 = h_2$ and $x_2$ and $x_0$ are nearly equal, the selected value of $r_p$ will be in the region of $r_b \cdot \sqrt{2}$.

An important feature of the invention is the attempt to equalize the pressures on either side of the wall 6, in the space between the fixed blades 9 and the rotating blades 7, to prevent leakage of the fluid and increase the efficiency.

These pressures will be close in value if $x_2$ is in the region of $x_1 \cdot h_2/(h_1 + h_2)$.

If $h_1 = h_2$, this means that $x_2$ should be about one half of $x_1$. If leakage of the fluid is prevented in this way, the seal 14 may be dispensed with and the walls 6 and 13 exactly aligned.

It should be noted that at final stage rotor blade radii greater than $r_p$, the curvature of the blades is greater that that of a long blade of conventional design at a distance $r_p$ from the axis. As a result, the blades in accordance with the invention are stronger than conventional blades, so that they can be made smaller and more easily.

The long rotor blades of the final stage may be made from chrome steel or titanium.

The fixed and moving blades of the penultimate stage 10 of the turbine in accordance with the invention are subjected to only part of the total flow, so that they are shorter than the blades of the penultimate stage of a conventional turbine.

This simplification enables the axial dimension of this stage to be reduced, so shortening the rotor.

In view of the advantages of the invention with regard to condensable fluids, the invention is particularly suited to use in steam turbines. It is equally useful, however, for the final stages of all kinds of turbine with large fluid throughputs, such as high-powered gas turbines, for example.

What is claimed is:

1. A multistage axial flow turbine for compressible fluids in which the fluid leaving the antepenultimate stage is separated into coaxial radially inner and radially outer flows which are subject to substantially the same decrease in enthalpy between the outlet from the antepenultimate stage and the outlet of the turbine, the inner flow passing through the penultimate and final stages with respective decreases in enthalpy of $h_1$ and $h_2$ and the outer flow passing through only the final stage, the rotor blades of the last stage including a wall serving as a barrier between the inner flow and the outer flow, the rotor blades of the last stage having a discontinuity in variation in profile from root to tip with the profile of the blade radially outward of the wall between the two flows being more highly curved than that radially inward of said wall, and the degree of reaction of said rotor blades at this barrier when operating under optimum conditions having a value $x_2$ on the outer flow side which is substantially equal to $x_1 \cdot h_2/(h_2 + h_1)$ where $x_1$ is the value of the degree of reaction on the inner flow side such that the pressure on the radially outward side of the wall is maintained substantially equal to the pressure on the radially inward side of the wall across said last stage rotor blades.

2. A turbine for compressible fluids according to claim 1, wherein $x_2$ is between 0.3 and 0.7 times $x_1$.

3. A turbine for compressible fluids according to claim 1 wherein the rotor blades of the final stage are made of titanium.

4. A turbine for compressible fluids according to claim 1, wherein the wall separating the coaxial inner and outer flows in the rotor of the final stage being at a mean distance $r_p$ from the turbine axis which is substantially equal to $$r_b \cdot \sqrt{\frac{h_1 + h_2}{h_2} \cdot \frac{1 - x_o}{1 - x_2}}$$

where $r_b$ is the distance of the blade roots from the turbine axis and $x_0$ is the degree of reaction at the base of the inner flow in the final stage.

5. A turbine for compressible fluids according to claim 4 wherein the wall between the coaxial inner and outer flows in the rotor of the final stage is at a mean distance $r_p$ from the turbine axis and $r_p$ is between 1.25 and 1.55 times $r_b$ where $r_b$ is the distance of the blade roots from the turbine axis.

6. A turbine for compressible fluids according to claim 1, wherein the decrease of enthalpy of the inner flow as it passes through the penultimate stage is substantially equal to the decrease of enthalpy as it flows through the final stage.

7. A turbine for compressible fluids according to claim 6, wherein $x_2$ is substantially equal to $x_1/2$.

8. A turbine for compressible fluids according to claim 6, wherein the wall between the coaxial inner and outer flows in the rotor of the final stage is at a mean distance $r_p$ from the turbine axis which is substantially equal to $r_b \cdot \sqrt{2 \cdot (1-x_0)/(1-x_2)}$, where $r_b$ is the distance of the blade roots from the turbine axis and $x_0$ is the degree of reaction at the base of the inner flow in the final stage.

9. A turbine for compressible fluids according to claim 6, wherein the wall between the coaxial inner and outer flows in the rotor of the final stage is at a mean distance $r_p$ from the turbine axis which is substantially equal to $r_b \cdot \sqrt{2}$, where $r_b$ is the distance of the blade roots from the turbine axis.

* * * * *

UNITED STATES PATENT AND TRADEMARK OFFICE
CERTIFICATE OF CORRECTION

PATENT NO. :    4,165,949
DATED       :   August 28, 1979
INVENTOR(S) :   Gilbert Riollet It is certified that error appears in the above-identified patent and that said Letters Patent are hereby corrected as shown below:

Column 2, line 65, change [1.35 and 1.55] to

---- 1.25 and 1.55 -----

Signed and Sealed this

*Fifteenth* Day of *January 1980*

[SEAL]

*Attest:*

SIDNEY A. DIAMOND

*Attesting Officer*     *Commissioner of Patents and Trademarks*